United States Patent
DeReus

(10) Patent No.: US 8,570,705 B2
(45) Date of Patent: Oct. 29, 2013

(54) MEMS SPRUNG CANTILEVER TUNABLE CAPACITORS AND METHODS

(75) Inventor: Dana DeReus, Santa Ana, CA (US)

(73) Assignee: Wispry, Inc., Irvine, CA (US)

( * ) Notice: Subject to any disclaimer, the term of this patent is extended or adjusted under 35 U.S.C. 154(b) by 296 days.

(21) Appl. No.: 13/007,255

(22) Filed: Jan. 14, 2011

(65) Prior Publication Data

US 2011/0176252 A1    Jul. 21, 2011

Related U.S. Application Data

(60) Provisional application No. 61/336,134, filed on Jan. 15, 2010.

(51) Int. Cl.
*H01G 7/00* (2006.01)
*H01G 7/06* (2006.01)

(52) U.S. Cl.
USPC ............................ 361/277; 361/280; 361/281

(58) Field of Classification Search
None
See application file for complete search history.

(56) References Cited

U.S. PATENT DOCUMENTS

| | | | |
|---|---|---|---|
| 6,906,905 B1 | 6/2005 | Chinthakindi | |
| 7,345,866 B1 * | 3/2008 | Hsu et al. ...................... | 361/277 |
| 2004/0012298 A1 * | 1/2004 | Cunningham et al. ......... | 310/306 |
| 2004/0036132 A1 | 2/2004 | Santos | |
| 2006/0291134 A1 | 12/2006 | Plowman et al. | |
| 2009/0067115 A1 * | 3/2009 | Arslan et al. ................... | 361/281 |
| 2011/0176252 A1 | 7/2011 | DeReus | |

FOREIGN PATENT DOCUMENTS

| | | |
|---|---|---|
| EP | 2524383 | 11/2012 |
| WO | WO 2011/088362 | 7/2011 |

OTHER PUBLICATIONS

International Search Report and Written Opinion for International Application No. PCT/US2011/021358 dated Sep. 27, 2011.

* cited by examiner

*Primary Examiner* — Jayprakash N Gandhi
*Assistant Examiner* — Dion Ferguson
(74) *Attorney, Agent, or Firm* — Jenkins, Wilson, Taylor & Hunt, P.A.

(57) ABSTRACT

The present subject matter relates to MEMS tunable capacitors and methods for operating such capacitors. The tunable capacitor can feature a primary stationary actuator electrode on a substrate, a secondary stationary actuator electrode on the substrate, a stationary RF signal capacitor plate electrode on the substrate, a sprung cantilever disposed over the substrate, a beam anchor connecting a first end of the sprung cantilever to the substrate, and one or more elastic springs or other biasing members connecting a second end of the sprung cantilever to the substrate, the second end being located distally from the first end. The spring cantilever can be movable between an OFF state defined by the potential difference between the stationary and moveable actuator electrodes being zero, and an ON state defined by a non-zero potential difference between the stationary and moveable actuator electrodes.

31 Claims, 4 Drawing Sheets

MEMS SPRUNG CANTILEVER TUNABLE CAPACITORS AND METHODS

RELATED APPLICATION

The subject matter disclosed herein claims priority to U.S. Patent Application Ser. No. 61/336,134, filed Jan. 15, 2010, the disclosure of which is incorporated herein by reference in its entirety.

TECHNICAL FIELD

The subject matter disclosed herein relates generally to Micro Electro-Mechanical System (MEMS) devices. More particularly, the subject matter disclosed herein relates to MEMS tunable capacitors and methods for operating such capacitors.

BACKGROUND

Desirable aspects for a radio frequency (RF) MEMS electrostatic tunable capacitor include, but are not limited to, the ability to be used in shunt or series configurations, high electrical quality factor, low sensitivity to external packaging effects, low sensitivity to temperature variations, low sensitivity to process variations, low actuation voltage, resistance to self-actuation due to applied RF energy, and large elastic restoring force in order to minimize stiction reliability concerns.

Cantilever beam actuator designs are good for addressing and minimizing external effects from packaging stresses, especially over temperature by isolating the MEMS beam element from the attachment substrate, but such structures can be sensitive to fabrication process variations, such as stress gradients which affect beam shape and relative displacement. Specifically, for example, they tend to be sensitive to fabrication process variations that influence the stress gradient through the beam, which in turn affect beam deflection in a negative fashion, particularly at the beam tip.

In addition, the typical electrostatic cantilever beam switch design has the signal capacitor head located at the distal end of the beam beyond the actuator motor region, which in turn makes it difficult to minimize the actuation pull-in voltage while at the same time trying to maximize the elastic restoring force in the beam such that the beam will return to its initial open un-actuated state when desired since the two have such tightly-coupled electro-mechanical behavior. Further, compared to a nominally flat coplanar MEMS cantilever beam structure, a cantilever beam deflected out-of-plane away from the substrate will require higher applied voltages for electrostatic actuation, which is usually an undesirable trait. A beam deflected towards the substrate will have undesirable traits of a lower self-actuation voltage and less restoring force available for overcoming adhesion forces in the actuated state.

Alternatively, multi-support MEMS switchable structures can address some of these issues of cantilever beams, but they can also introduce new problems. For instance, multi-support MEMS switchable structures often require narrow and/or folded support structures in order to minimize influences from residual stresses, thermal stresses, and substrate effects on the structural shape. Such multiple narrow folded support structures, while good for mechanical considerations, are not conducive to good electrical design considerations of minimizing insertion loss for RF signals routed onto the MEMS element structure. This is primarily due to the inherent increase in electrical path resistance and inductance of narrow folded support beams when compared to an RF signal running onto a straight wide cantilever beam.

As a result, it would be beneficial to decouple mechanical design from electrical design such that each aspect can be designed and optimized in a more independent fashion to meet performance, reliability, and cost objectives, as well as providing robustness to process and temperature variation.

SUMMARY

In accordance with this disclosure, MEMS tunable capacitors and methods for operating such capacitors are provided. In one aspect, a MEMS tunable capacitor is provided. The tunable capacitor can comprise a primary stationary actuator electrode on a substrate, a secondary stationary actuator electrode on the substrate, a stationary RF signal capacitor plate electrode on the substrate, a sprung cantilever disposed over the substrate, a beam anchor connecting a first end of the sprung cantilever to the substrate, and one or more elastic springs or other biasing members connecting a second end of the sprung cantilever to the substrate, where the second end can be located distally from the first end. The sprung cantilever can itself comprise a primary movable actuator electrode positioned over the primary stationary actuator electrode, a secondary movable actuator electrode positioned over the secondary stationary actuator electrode, an RF signal path, and a movable RF signal capacitor plate in communication with the RF signal path and positioned over the stationary RF signal capacitor plate electrode. The spring cantilever can be movable between an OFF state that can be defined by the potential difference between the stationary and moveable actuator electrodes being zero and an ON state that can be defined by a non-zero potential difference between the stationary and moveable actuator electrodes.

In another aspect, a method of operating a MEMS tunable capacitor is provided. The method can comprise disposing a sprung cantilever over a substrate, the sprung cantilever comprising a primary movable actuator electrode positioned over a primary stationary actuator electrode deposited on the substrate, a secondary movable actuator electrode positioned over secondary stationary actuator electrode deposited on the substrate, an RF signal path, and a movable RF signal capacitor plate in communication with the RF signal path and positioned over a stationary RF signal capacitor plate electrode deposited on the substrate. The method can further comprise moving the sprung cantilever between an OFF state that can be defined by the potential difference between the stationary and moveable actuator electrodes being zero and an ON state that can be defined by a non-zero potential difference between the stationary and moveable actuator electrodes.

Although some of the aspects of the subject matter disclosed herein have been stated hereinabove, and which are achieved in whole or in part by the presently disclosed subject matter, other aspects will become evident as the description proceeds when taken in connection with the accompanying drawings as best described hereinbelow.

BRIEF DESCRIPTION OF THE DRAWINGS

The features and advantages of the present subject matter will be more readily understood from the following detailed description which should be read in conjunction with the accompanying drawings that are given merely by way of explanatory and non-limiting example, and in which.

DETAILED DESCRIPTION

Figure 1A:
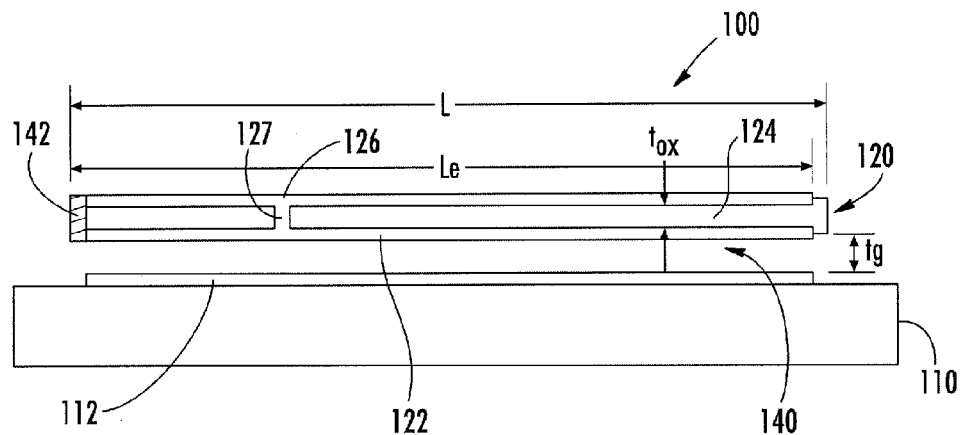
FIG. 1a is a side cutaway view of a MEMS tunable capacitor according to an embodiment of the presently disclosed subject matter.

The present subject matter provides MEMS tunable capacitors and methods for operating such capacitors. The base structure of the MEMS actuators and other devices discussed herein can be fabricated using a known process, such as the process described in U.S. Pat. No. 6,917,086, titled "Trilayered beam MEMS device and related methods"; U.S. Pat. No. 6,746,891, titled "Trilayered beam MEMS device and related methods"; and U.S. Pat. No. 6,876,047, titled "MEMS device having a trilayered beam and related methods", the disclosures of which are incorporated by reference herein in their entireties. These patents describe methods for fabricating an actuator having a trilayered beam, each of which comprises: (a) forming a first electrode on a substrate; (b) depositing a sacrificial layer on the first electrode and the substrate; (c) forming a second electrode on the sacrificial layer; (d) depositing a structural layer on the second electrode and the sacrificial layer; (e) forming a via through the structural layer to the second electrode; (f) depositing a conductive layer on the structural layer and in the via; (g) forming a conductive microstructure by removing a portion of the conductive layer, wherein the conductive microstructure electrically communicates with the second electrode through the via; and (h) removing the sacrificial layer so as to separate the second electrode from the substrate, wherein the structural layer is supported by the substrate at a first end and is freely suspended above the substrate at an opposing second end as a cantilevered structure, or wherein the structural layer is supported by the substrate at two or more points. It should be understood, however, that the devices discussed in this disclosure are not limited by the number of material layers comprising a beam actuator. Rather, they can be realized and implemented using a mono-layer, bi-layer, or any other higher numbered multi-layered composite beam structure.

For instance, an example of a MEMS cantilever beam electrostatic actuator, generally designated 100, created in the tri-layered process described above is shown in FIGS. 1a and 1b. Actuator 100 can comprise a stationary actuator electrode 112 on a substrate 110. Substrate 110 can be a conductor or semiconductor with the appropriate isolation material or an isolating dielectric substrate. Stationary actuator electrode 112 can be defined (e.g., deposited and patterned) by a metal layer on substrate 100.

A cantilever beam 120 having a beam length L can be disposed over substrate 110. Cantilever beam 120 can comprise a movable actuator electrode 122 defined by the metal layer on top of the sacrificial layer. Movable actuator electrode 122 can have an electrode length $L_e$, which can be less than beam length L, and an electrode width $W_e$. Stationary and movable actuators electrodes 112 and 122 can be separated from each other by an "air" gap 140 spanning a distance $t_g$ as defined in FIG. 1a, which is created upon the removal of the sacrificial layer. It is to be understood that the term "air" as used herein is not limited to atmospheric air, but can comprise any isolating fluid. A beam structural layer 124 can be defined by the deposition and patterning of the structural dielectric material, which can be any dielectric material that can be appropriately processed (e.g., $SiO_2$, $Al_2O_3$), can provide excellent electrical isolation and mechanical properties. Cantilever beam 120 can be maintained in this position over substrate 110 by a beam anchor 142 connecting a first end of cantilever beam 120 to substrate 110.

Figure 1B:
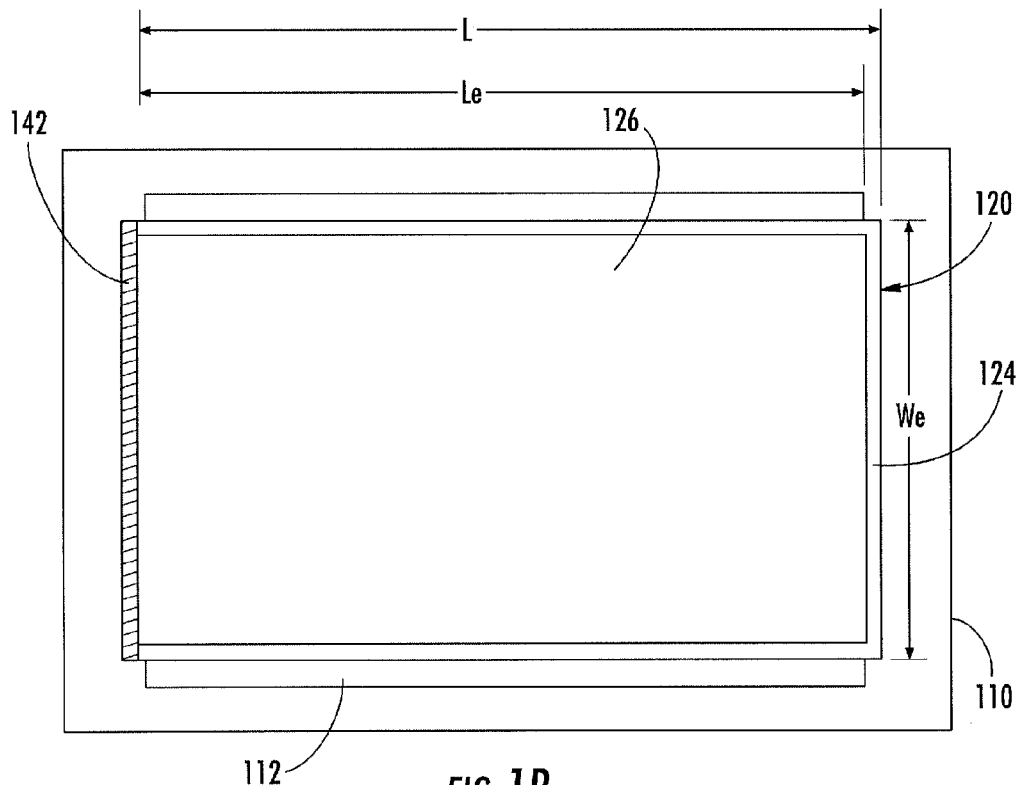
FIG. 1b is a top plan view of a MEMS tunable capacitor according to an embodiment of the presently disclosed subject matter.

The thickness of beam structural layer 124, shown in FIG. 1a as thickness $t_{ox}$, can determine much of the mechanical behavior of actuator 100. On top of beam structural layer 124, a conductive layer 126 can be defined. Conductive layer 126 can be electrically interconnected to movable actuator electrode 122 by a via 127, and it can act as a mechanical balance with movable actuator electrode 122. It is noted that conductive layer 126 is not limited to any particular composition since actuator 100 can be designed to work with any combination of metals and dielectric.

Figure 2A:
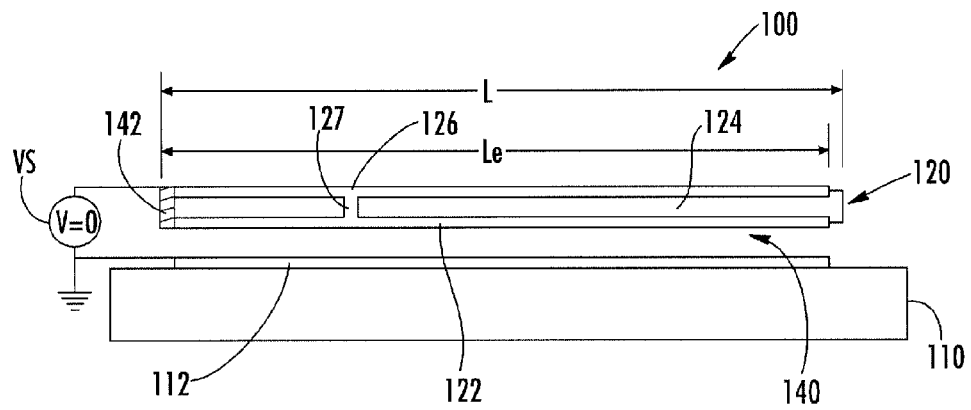
FIG. 2a is a side cutaway view of a MEMS tunable capacitor in a first operating position according to an embodiment of the presently disclosed subject matter.
Figure 2B:
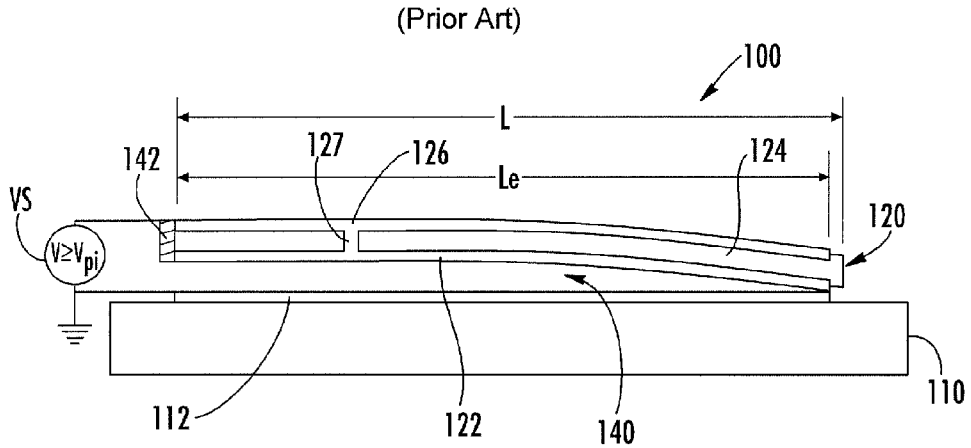
FIG. 2b is a side cutaway view of a MEMS tunable capacitor in a second operating position according to an embodiment of the presently disclosed subject matter.

With this structure, actuation of actuator 100 can be achieved by applying a voltage potential difference between stationary actuator electrode 112 and movable actuator electrode 122 as shown in FIGS. 2a and 2b. A voltage source VS can be connected between stationary actuator electrode 112 and conductive layer 126. As discussed above, conductive layer 126 can be electrically connected to movable actuator electrode 122 through via 127, and thus the operation of voltage source VS can result in electrostatic coupling between stationary and movable actuator electrodes 112 and 122 across "air" gap 140.

Specifically, the applied potential can create an electrostatic force that causes cantilever beam 120 to deflect towards substrate 110. This deflection can occur in a non-linear yet stable manner until pull-in occurs, after which point cantilever beam 120 deflects to substrate 110 in an unstable fashion. As depicted in FIG. 2a, the unactuated (i.e., "OFF" or "open") position shows cantilever beam 120 in an undeflected position, with a zero potential difference between stationary and movable actuator electrodes 112 and 122. Referring to FIG. 2b, the actuated (i.e., "ON" or "closed") position shows cantilever beam 120 deflected into contact with substrate 110, with the potential difference between the electrodes being greater than the pull-in voltage. Upon pull-in, stationary and movable actuator electrodes 112 and 122 may come into contact with one another and short together.

Stationary and movable actuator electrodes 112 and 122 can be prevented from shorting together upon pull-in by introducing a continuous or patterned dielectric insulator on one or both of the actuator electrodes, or through the creation of standoff features that would prevent the conductive electrodes from coming into intimate contact with each other. For instance, standoff bumps are described in U.S. Pat. No. 6,876,482, entitled "MEMS Device Having Contact and Standoff Bumps and Related Methods", the disclosure of which is incorporated by reference herein in its entirety. Such standoff bumps may be incorporated into any of the device designs disclosed herein in order to add functionality and/or improve reliability. Specifically, standoff bumps can add functionality by acting as mechanical pivot points for controlling rotational motion or by limiting displacements of the various regions of the actuator. Further, standoff bumps can improve device reliability when used to reduce and/or limit charging of dielectric material located between the stationary and movable actuator electrodes, especially when the actuator is in a "closed" state post pull-in, by helping to control the strength of the electric field through control of the spacing between actuator conductor plates, and also by helping to minimize dielectric to dielectric contact and associated triboelectric charging. In addition, standoff bumps may be used to help improve device reliability by decreasing contact area which in turn decreases the strength of the adhesive forces that in general lend themselves to stiction reliability problems in MEMS devices.

Figure 3A:
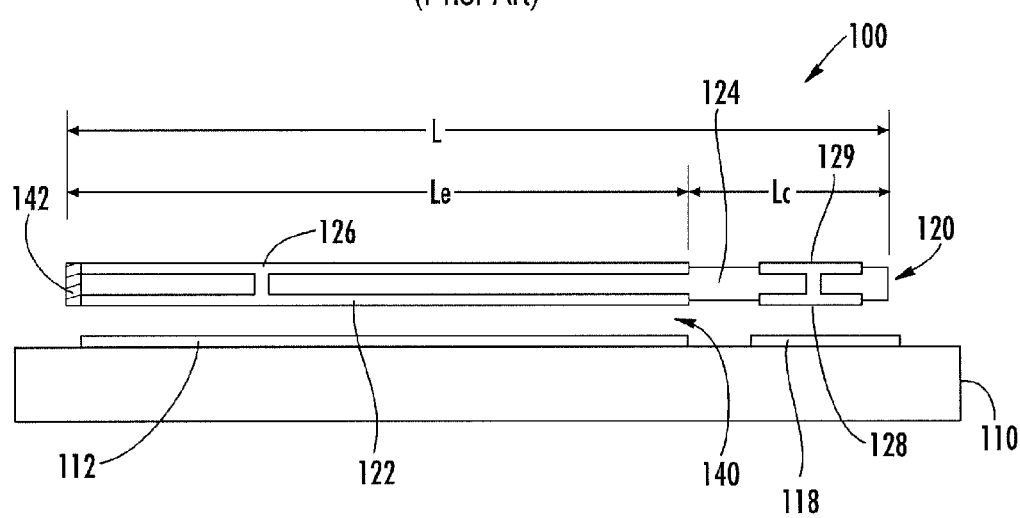
FIG. 3a is a side cutaway view of a MEMS tunable capacitor according to an embodiment of the presently disclosed subject matter.
Figure 3B:
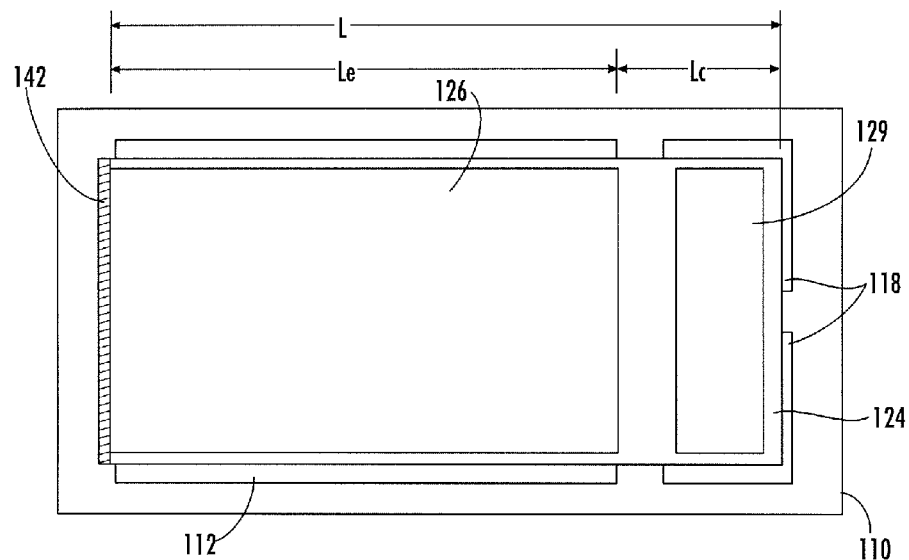
FIG. 3b is a top plan view of a MEMS tunable capacitor according to an embodiment of the presently disclosed subject matter.

MEMS cantilever beam electrostatic actuator 100 as depicted in FIGS. 1a, 1b, 2a, and 2b can be used in applications as a capacitive contact or ohmic (DC) contact switching device. For instance, an example of a cantilever beam capacitive contact switch is shown in FIGS. 3a and 3b. In this example, MEMS cantilever beam electrostatic actuator 100 can serve as a variable signal capacitor with the addition of a stationary capacitor plate 118 on substrate 110 and a movable capacitor plate 128 located at a distal end of cantilever beam 120 (and a capacitor region 129 on a top surface of cantilever beam 120 and spaced across beam structural layer 124 from movable capacitor plate 128). Cantilever beam 120 can thus be divided into an electrode region delineated by electrode length $L_e$ and a capacitor region having a capacitor length $L_c$. In this configuration, actuator 100 can be used to modulate the coupling between stationary and movable capacitor plates 118 and 128 by varying the spacing between the two conductors, thus varying the value of the signal coupling capacitance.

As discussed above, however, there are a number of potential drawbacks to using a cantilever beam style of actuator, including sensitivity to fabrication process variations, difficulty in minimizing the actuation pull-in voltage while trying to maximize the elastic restoring force in the beam, and requirements of comparatively higher applied voltages for electrostatic actuation. Multi-support structures can address some of these issues, but they can also frustrate other beneficial considerations, such as minimizing insertion loss for RF signals routed onto the MEMS element structure.

Figure 4:
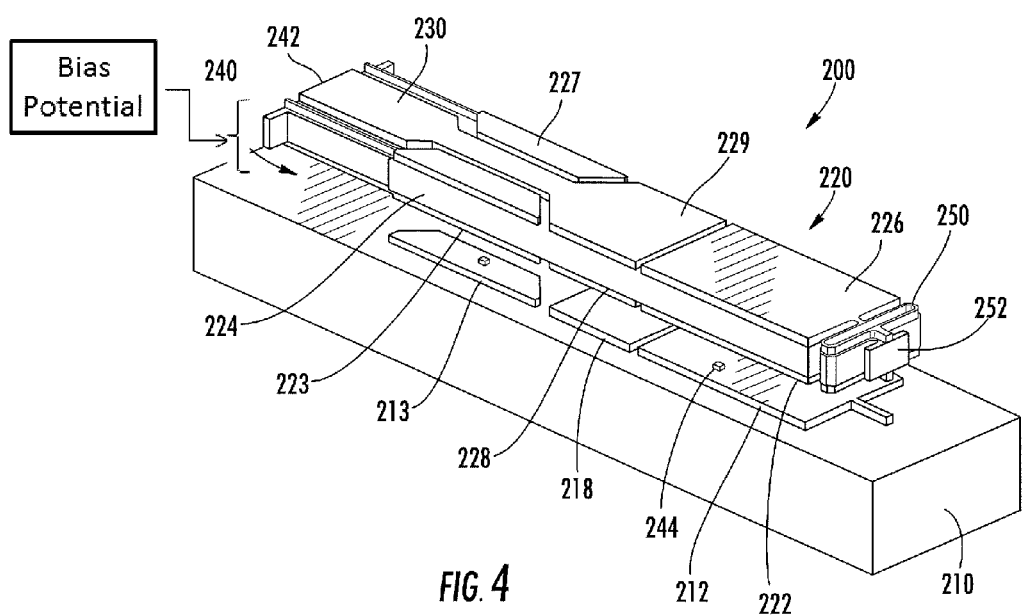
FIGS. 4 and 5 are perspective views of a MEMS tunable capacitor according to two embodiments of the presently disclosed subject matter.

With these considerations in mind, FIG. 4 illustrates a MEMS sprung cantilever switchable capacitor, generally designated 200, which can comprise a cantilever beam structure that is substantially similar to those found in actuator 100 shown in FIGS. 1a-3b. Specifically, switchable capacitor 200 can comprise a substrate 210 having a primary stationary actuator electrode 212 and a stationary RF signal capacitor plate electrode 218 deposited or otherwise formed thereon, and a sprung cantilever 220 similar to the cantilever beam discussed above disposed over the substrate and itself comprising a primary movable actuator electrode 222 positioned over primary stationary actuator electrode 212, a movable RF signal capacitor plate 228 positioned over stationary RF signal capacitor plate electrode 218, a beam structural layer 224, and a primary actuator region 226 and a RF signal switchable capacitor region 229 interconnected to primary movable actuator electrode 222 and movable RF signal capacitor plate 228, respectively, across beam structural layer 224. An "air" gap 240 (e.g., a gap of about 2 µm) can separate sprung cantilever 220 from substrate 210 over at least a substantial portion of its length, while a beam anchor 242 can connect a first end of sprung cantilever 220 to substrate 210.

As shown in FIG. 4, rather than a single actuator pair coupling sprung cantilever 220 from substrate 210, multiple stationary and movable actuator electrodes can be provided. Specifically, for example, switchable capacitor 200 can further comprise a secondary stationary actuator electrode 213 on substrate 210, such as but not limited to by deposition onto substrate 210, a secondary movable actuator electrode 223 on sprung cantilever 220 and positioned over secondary stationary actuator electrode 213, and a secondary actuator region 227 interconnected to secondary movable actuator electrode 223.

The embodiment shown in FIG. 4 further can comprise isolation stand-off bumps 244 as discussed above. Isolation stand-off bumps 244 can be positioned on one or more of primary stationary actuator electrode 212 and secondary stationary actuator electrode 213. Such isolation stand-off bumps 244 can be primarily used to limit the amount of contact area and control "air" gap spacing between stationary and movable objects when the switch is in an actuated closed state. Minimizing contact area between two surfaces in intimate contact or controlling the spacing between surfaces in close proximity can help to improve switch reliability by reducing the magnitude of adhesion forces which can lead to stiction failure modes. Isolation stand-off bumps 244 can also act as mechanical pivots and can be used in conjunction with energizing and de-energizing sequencing of the various independently controllable actuation regions, in order to control kinematic behavior during switch closing and opening events. Isolation stand-off bumps 244 can also provide a means for controlling the capacitance density for any of the variable gap capacitor regions.

With this structure sprung cantilever 220 can thus be movable between an OFF state that can be defined by a potential difference between the stationary and moveable actuator electrodes being zero and an ON state that can be defined by a non-zero potential difference between the stationary and moveable actuator electrodes. In particular, in the OFF state, the potential difference can be zero both between primary stationary actuator electrode 212 and primary moveable actuator electrode 222 and between secondary stationary actuator electrode 213 and secondary moveable actuator electrode 223. For instance, moving the sprung cantilever 220 from an ON state to an OFF state can comprise simultaneously providing substantially the same voltage to all of primary movable actuator electrode 222, primary stationary actuator electrode 212, secondary movable actuator electrode 223, and secondary stationary actuator electrode 213. Alternatively, moving the sprung cantilever 220 from an ON state to an OFF state can comprise establishing a potential difference of zero between primary movable actuator electrode 222 and primary stationary actuator electrode 212 either before or after establishing a potential difference of zero between secondary movable actuator electrode 223 and secondary stationary actuator electrode 213.

Similarly, in the ON state, the potential difference between primary stationary actuator electrode 212 and primary moveable actuator electrode 222 can be substantially the same as the potential difference between secondary stationary actuator electrode 213 and secondary moveable actuator electrode 223. Alternatively, in the ON state, the potential difference between primary stationary actuator electrode 212 and primary moveable actuator electrode 222 can be different than the potential difference between secondary stationary actuator electrode 213 and secondary moveable actuator electrode 223. In either case, the pairs of actuator electrodes can be operated independently such that the potential difference between primary stationary actuator electrode 212 and primary moveable actuator electrode 222 is established either before or after establishing the potential difference between secondary stationary actuator electrode 213 and secondary moveable actuator electrode 223.

In addition to the features found in typical cantilever beam actuators, switchable capacitor 200 can also comprise a mechanical elastic spring or other suspension system, generally designated 250, located at the distal end of sprung cantilever 220 (i.e., at a second end opposite the first end connected to beam anchor 242). Spring 250 can connect the distal end to substrate 210 by way of a spring anchor 252. In this way, sprung cantilever 220 can be effectively suspended at both ends above substrate 210. Spring 250 can function to limit out-of-plane beam structure deflection due to intrinsic stress gradients and to limit the variability of the deflection due to variations in both fabrication process and ambient temperature. For this purpose, spring 250 can be designed such that it is relatively stiff in the vertical out-of-plane direction in order to limit out-of-plane deflections due to stress gradients, while at the same time it can be relatively compliant in the in-plane longitudinal direction to reduce the potentially negative influence of in-plane stresses and to help decouple sprung cantilever 220 from substrate 210.

Figure 5:
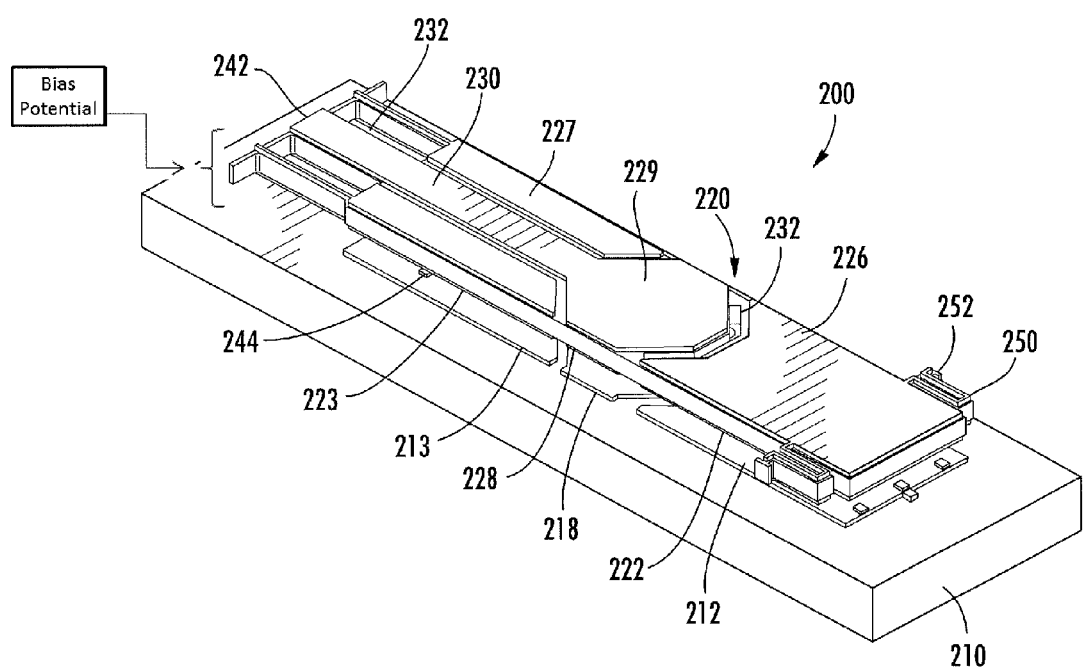

As in the particular configuration shown in FIG. 4, spring 250 can be a simple box spring, but it should be understood that other forms for spring 250 (e.g., a folded spring, an x-spring) can provide desirable functionality so long as it satisfies general desirable mechanical qualities of an elastic spring that limits out-of-plane beam deflection and relieves in-plane longitudinal stresses and bending moments. In addition, although the configuration shown in FIG. 4 includes only a single spring 250, additional springs can be located at various positions in the vicinity of the tip of sprung cantilever 220, which can satisfy the requirement of limiting out of plane deflections while at the same time decoupling sprung cantilever 220 from surrounding substrate effects. By way of specific example, FIG. 5 illustrates an embodiment of switchable capacitor 200 having two springs 250 (folded springs in this configuration) located along the sides of sprung cantilever 220, but still positioned near the second, distal end of sprung cantilever 220. These springs 250 are again provided with the intent of limiting out-of-plane beam deflection while at the same time decoupling sprung cantilever 220 from substrate 210 and minimizing substrate effects.

Regardless of the specific configuration, switchable capacitor 200 can embody desirable design aspects from single support cantilever structures and multi-support structures, while at the same time minimizing the worst aspects of each type of structure. For example, the sprung cantilever beam structure of switchable capacitor 200 can allow for a wide RF signal feed coming onto the beam in order to eliminate losses associated with running the RF signal through narrow folded support structures. This structure can thus allow for a certain amount of decoupling of the electrical design for RF considerations from the mechanical design requirements. The width of the RF signal path feed can be designed to meet desired electrical performance requirements without substantially modifying the structural element mechanical boundary conditions created by the substrate.

In this regard, referring again to FIG. 4, switchable capacitor 200 can comprise a RF electrical path consisting of a RF signal path 230 leading to RF signal switchable capacitor region 229. In particular, as shown in FIG. 4, RF signal path 230 can be routed onto sprung cantilever 220 at its first end connected to beam anchor 242. RF signal path 230 can be electrically isolated (e.g., by dielectrics) from the conductors used for switch electrostatic actuation. This separation of RF signal path 230 from the actuator conductors allows for switchable capacitor 200 to be used in either shunt or series electrical circuit configurations. The flexibility (shunt or series) provided by a single switch structure is beneficial from a processing perspective in that the process may be optimized for a single particular switch design rather than trying to optimize for two different structures that respond to stress gradients in different fashions.

The segmented primary and secondary actuator regions 226 and 227 of sprung cantilever 220 depicted in FIG. 4 can provide several benefits relative to switch actuation behavior. First, primary and secondary actuator regions 226 and 227 can be designed in their size and location to customize the electrostatic pull-in and zipping behavior of each of the respective actuator regions. This customization can allow for a certain degree of control over the kinematic behavior resulting from electrostatic actuation. Second, the segmented actuator regions can be configured to be separately energized and de-energized in any possible combination (e.g., all at the same time, in sequence) in any desired order and timing. Third, the distribution of the actuator areas around RF signal switchable capacitor region 229 allows the electrostatic forces to be applied in a fashion to help flatten the RF capacitor, region thus improving capacitance density, and to help minimize effects of process variation that lead to curvature of movable RF signal capacitor plate 228.

The in-plane shape of movable RF signal capacitor plate 228 and RF signal switchable capacitor region 229 can be designed to control the electro-mechanics and facilitate packing density and capacitance density. The shape of RF signal switchable capacitor region 229 in conjunction with the placement of the electrostatic actuation electrodes can affect how the electrostatic actuation forces can be used to influence the deformed shape of RF signal switchable capacitor region 229. For instance, FIG. 5 depicts RF signal switchable capacitor region 229 as having an octagonal shape as opposed to the rectangular shape shown in FIG. 4. The octagonal shape is more area efficient (i.e. effective capacitance density) compared to the rectangular RF signal switchable capacitor region 229 depicted in FIG. 4 because a good portion of the RF feed transition region from the comparatively narrow RF signal path 230 to the wider RF signal switchable capacitor region 229 can be used for RF capacitor overlap area. In addition, primary and secondary actuation regions 226 and 227 can be more effectively distributed around the octagonal RF signal switchable capacitor region 229 as compared to a rectangular configuration, which is beneficial for influencing the deformed shape on RF signal switchable capacitor region 229 with the intent of improving capacitance density. Of course, it should be understood that movable RF signal capacitor plate 228 and RF signal switchable capacitor region 229 can have any of a variety of other shapes (e.g., hexagonal, circular, elliptical, trapezoidal) based on the design considerations of the system. For instance, the size and/or shape of one or both of movable RF signal capacitor plate 228 and RF signal switchable capacitor region 229 can be selected to control properties of switchable capacitor 200, such as effective capacitance density, packing density, beam flatness, electrical resistance, and/or parasitic capacitive coupling. In addition, it should further be understood that movable RF signal capacitor plate 228 can be sized or shaped to be the same as or substantially similar to the size and shape of RF signal switchable capacitor region 229, or the two components can be different.

Beam electro-mechanics may be tuned via strategically placed through beam slots 232, which can be designed to provide beam compliancy where desired. An example of beam slotting for compliancy considerations is shown in FIG. 5 where the beam is slotted near the wide anchor point and also between RF signal switchable capacitor region 229 and primary actuator region 226. It should be understood, however, that this configuration is one of a variety of potential placements for through beam slots 232. For example, through beam slots 232 can be provided between movable RF signal capacitor plate 228 and either or both of primary movable actuator electrode 222 or secondary movable actuator electrode 223, and/or they can be provided between RF signal path 230 and movable RF signal capacitor plate 228 and either or both of primary movable actuator electrode 222 or secondary movable actuator electrode 223. Through beam slotting can be used to electrically decouple conductors on sprung cantilever 220 or mechanically decouple one region on sprung cantilever 220 from another.

The present subject matter can be embodied in other forms without departure from the spirit and essential characteristics thereof. The embodiments described therefore are to be considered in all respects as illustrative and not restrictive. Although the present subject matter has been described in terms of certain preferred embodiments, other embodiments that are apparent to those of ordinary skill in the art are also within the scope of the present subject matter.

What is claimed is:

1. A MEMS tunable capacitor comprising:
    a primary stationary actuator electrode on a substrate;
    a secondary stationary actuator electrode on the substrate;
    a stationary RF signal capacitor plate electrode on the substrate;
    a sprung cantilever disposed over the substrate, the sprung cantilever comprising:
        a primary movable actuator electrode positioned over the primary stationary actuator electrode;
        a secondary movable actuator electrode positioned over the secondary stationary actuator electrode;
        a RF signal path that is electrically isolated from the primary movable actuator electrode and the secondary movable actuator electrode; and
        a movable RF signal capacitor plate in communication with the RF signal path and positioned over the stationary RF signal capacitor plate electrode;
    a beam anchor connecting a first end of the sprung cantilever to the substrate; and
    one or more elastic springs or other biasing members connecting a second end of the sprung cantilever to the substrate, the second end being located distally from the first end;
    wherein the sprung cantilever is movable between an OFF state defined by the potential difference between the stationary and moveable actuator electrodes being zero, and an ON state defined by a non-zero potential difference between the stationary and moveable actuator electrodes.

2. The MEMS tunable capacitor of claim 1, wherein the sprung cantilever is separated from the substrate by an air gap.

3. The MEMS tunable capacitor of claim 2, wherein the air gap is about 2 μm wide.

4. The MEMS tunable capacitor of claim 1, wherein the RF signal path is electrically isolated from the primary movable actuator electrode and the secondary movable actuator electrode.

5. The MEMS tunable capacitor of claim 1, wherein the RF signal path is routed onto the sprung cantilever at the first end of the sprung cantilever.

6. The MEMS tunable capacitor of claim 1, wherein the stationary RF signal capacitor plate and the movable RF signal capacitor plate are each shaped to facilitate packing density and capacitance density.

7. The MEMS tunable capacitor of claim 6, wherein the stationary RF signal capacitor plate and the movable RF signal capacitor plate each have a shape selected from one of a rectangle, a hexagon, or an octagon.

8. The MEMS tunable capacitor of claim 1, wherein one or both of a shape or size of the stationary RF signal capacitor plate is substantially similar to a shape or size of the movable RF signal capacitor plate.

9. The MEMS tunable capacitor of claim 1, wherein one or both of a shape or size of the stationary RF signal capacitor plate is different than a shape or size of the movable RF signal capacitor plate.

10. The MEMS tunable capacitor of claim 1, wherein the elastic spring is connected to the sprung cantilever at the second end of the sprung cantilever.

11. The MEMS tunable capacitor of claim 1, wherein the elastic spring is connected to the sides of the sprung cantilever near the second end of the sprung cantilever.

12. The MEMS tunable capacitor of claim 1, wherein the elastic spring is selected from the group comprising a box spring, a folded spring, and an x-spring.

13. The MEMS tunable capacitor of claim 1, wherein the elastic spring is relatively stiffer in a vertical out-of-plane direction and relatively more compliant in an in-plane longitudinal direction.

14. The MEMS tunable capacitor of claim 1, wherein in the OFF state the potential difference is zero both between the primary stationary actuator electrode and the primary moveable actuator electrode and between the secondary stationary actuator electrode and the secondary moveable actuator electrode.

15. The MEMS tunable capacitor of claim 1, wherein in the ON state the potential difference between the primary stationary actuator electrode and the primary moveable actuator electrode is substantially the same as the potential difference between the secondary stationary actuator electrode and the secondary moveable actuator electrode.

16. The MEMS tunable capacitor of claim 1, wherein in the ON state the potential difference between the primary stationary actuator electrode and the primary moveable actuator electrode is different than the potential difference between the secondary stationary actuator electrode and the secondary moveable actuator electrode.

17. The MEMS tunable capacitor of claim 1, wherein the sprung cantilever comprises one or more through beam slots.

18. The MEMS tunable capacitor of claim 17, wherein the through beam slots are positioned between the movable RF signal capacitor plate and either or both of the primary movable actuator electrode or the secondary movable actuator electrode.

19. The MEMS tunable capacitor of claim 17, wherein the through beam slots are positioned between the RF signal path and the movable RF signal capacitor plate and either or both of the primary movable actuator electrode or the secondary movable actuator electrode.

20. The MEMS tunable capacitor of claim 1, comprising one or more isolation stand-off bumps positioned between the substrate and the sprung cantilever.

21. The MEMS tunable capacitor of claim 20, wherein the isolation stand-off bumps are positioned on one or more of the primary stationary actuator electrode and the secondary stationary actuator electrode.

22. A MEMS tunable capacitor comprising:
    a primary stationary actuator electrode deposited on a substrate;
    a secondary stationary actuator electrode deposited on the substrate;
    a stationary RF signal capacitor plate electrode deposited on the substrate;

a sprung cantilever suspended over the substrate, the sprung cantilever being separated from the substrate by an air gap, the sprung cantilever comprising:
   a primary movable actuator electrode positioned over the primary stationary actuator electrode;
   a secondary movable actuator electrode positioned over the secondary stationary actuator electrode;
   a RF signal path that is electrically isolated from the primary movable actuator electrode and the secondary movable actuator electrode; and
   a movable RF signal capacitor plate in communication with the RF signal path and positioned over the stationary RF signal capacitor plate electrode;
a beam anchor connecting a first end of the sprung cantilever to the substrate; and
one or more elastic springs or other biasing members connecting a second end of the sprung cantilever to the substrate, the second end being located distally from the first end;
wherein the sprung cantilever is movable between an OFF state defined by the potential difference between the stationary and moveable actuator electrodes being zero, and an ON state defined by a non-zero potential difference between the stationary and moveable actuator electrodes.

23. A method of operating a MEMS tunable capacitor comprising:
disposing a sprung cantilever over a substrate such as by suspension, the sprung cantilever comprising:
   a primary movable actuator electrode positioned over a primary stationary actuator electrode deposited on the substrate;
   a secondary movable actuator electrode positioned over secondary stationary actuator electrode deposited on the substrate;
   a RF signal path that is electrically isolated from the primary movable actuator electrode and the secondary movable actuator electrode; and
   a movable RF signal capacitor plate in communication with the RF signal path and positioned over a stationary RF signal capacitor plate electrode deposited on the substrate; and
moving the sprung cantilever between an OFF state that can be defined by the potential difference between the stationary and moveable actuator electrodes being zero and an ON state that can be defined by a non-zero potential difference between the stationary and moveable actuator electrodes.

24. The method of claim 23, wherein moving the sprung cantilever to the OFF state comprises establishing a potential difference of zero both between the primary stationary actuator electrode and the primary moveable actuator electrode and between the secondary stationary actuator electrode and the secondary moveable actuator electrode.

25. The method of claim 23, wherein moving the sprung cantilever to the ON state comprises establishing a potential difference between the primary stationary actuator electrode and the primary moveable actuator electrode that is substantially the same as the potential difference between the secondary stationary actuator electrode and the secondary moveable actuator electrode.

26. The method of claim 23, wherein moving the sprung cantilever to the ON state comprises establishing a potential difference between the primary stationary actuator electrode and the primary moveable actuator electrode that is different than the potential difference between the secondary stationary actuator electrode and the secondary moveable actuator electrode.

27. The method of claim 23, wherein moving the sprung cantilever to the ON state comprises establishing the potential difference between the primary stationary actuator electrode and the primary moveable actuator electrode before establishing the potential difference between the secondary stationary actuator electrode and the secondary moveable actuator electrode.

28. The method of claim 23, wherein moving the sprung cantilever to the ON state comprises establishing the potential difference between the secondary stationary actuator electrode and the secondary moveable actuator electrode before establishing the potential difference between the primary stationary actuator electrode and the primary moveable actuator electrode.

29. The method of claim 23, wherein moving the sprung cantilever from an ON state to an OFF state comprises simultaneously providing substantially the same voltage to the primary movable actuator electrode, the primary stationary actuator electrode, the secondary movable actuator electrode, and the secondary stationary actuator electrode.

30. The method of claim 23, wherein moving the sprung cantilever from an ON state to an OFF state comprises establishing a potential difference of zero between the primary movable actuator electrode and the primary stationary actuator electrode before establishing a potential difference of zero between the secondary movable actuator electrode and the secondary stationary actuator electrode.

31. The method of claim 23, wherein moving the sprung cantilever from an ON state to an OFF state comprises establishing a potential difference of zero between the secondary movable actuator electrode and the secondary stationary actuator electrode before establishing a potential difference of zero between the primary movable actuator electrode and the primary stationary actuator electrode.

* * * * *